(12) United States Patent
Träber

(10) Patent No.: US 7,305,425 B2
(45) Date of Patent: Dec. 4, 2007

(54) METHOD AND DEVICE FOR DIGITAL FILTERING OF INTERPOLATED VALUES

(75) Inventor: Mario Träber, Deisenhofen (DE)

(73) Assignee: Infineon Technologies AG, Munich (DE)

( * ) Notice: Subject to any disclaimer, the term of this patent is extended or adjusted under 35 U.S.C. 154(b) by 827 days.

(21) Appl. No.: 10/650,565

(22) Filed: Aug. 27, 2003

(65) Prior Publication Data

US 2005/0249320 A1    Nov. 10, 2005

(30) Foreign Application Priority Data

Aug. 30, 2002   (DE)   ............... 102 40 135

(51) Int. Cl.
*G06F 17/10* (2006.01)
*G06F 15/00* (2006.01)

(52) U.S. Cl. ............ 708/300; 708/203; 708/313

(58) Field of Classification Search ............. 708/313, 708/300, 203
See application file for complete search history.

(56) References Cited

U.S. PATENT DOCUMENTS

| 5,805,715 | A * | 9/1998 | Rhee | 381/98 |
| 5,933,452 | A * | 8/1999 | Eun | 375/232 |
| 6,351,781 | B1 * | 2/2002 | Gracias et al. | 710/22 |
| 7,072,429 | B1 * | 7/2006 | Sogo | 375/350 |

FOREIGN PATENT DOCUMENTS

DE    0 632 940 B1    1/1995

OTHER PUBLICATIONS

A. Oppenheim et al., Zeitdiskrete Signalverarbeitung, 3$^{rd}$ edition, pp. 121-135, 146-154, and 349-357 (1999).
N. Fliege, Multiraten-Signalverarbeitung: Theorie und Anwendungen, Stuttgart: Teubner-Verlag, pp. 32-44, 112f (1993).
W. Heise et al., Informations- und Codierungstheorie, 2$^{nd}$ edition, Berlin et al., Springer-Verlag, pp. 128-138 (1989).
E. Hogenauer, An Economical Class of Digital Filters for Decimation and Interpolation, In: IEEE Transactions on Accoustics, Speeach and Signal Processing, vol. ASSP-29, No. 2, pp. 155-162 (1981).

* cited by examiner

*Primary Examiner*—Chuong D Ngo
(74) *Attorney, Agent, or Firm*—Peter F. Corless; Steven M. Jensen; Edwards Angell Palmer & Dodge LLP

(57) ABSTRACT

In the digital filtering of an input signal (3), which has been produced by interpolation of a pilot signal (2), under certain circumstances numerous values originating from the past have to be stored. In order to reduce the storage space required for these and the associated power consumption, the values of the input signal (3), which are needed for computation of the values of an output signal (4), are compressed and stored in compressed form. More particularly here the values of the input signal (3) are divided into symbol periods, in which a coherent range of memory values, which are the only data-carrying values in the symbol period, occurs in each case. These values are stored together with the length of the symbol period, so that although each symbol period can be described completely, storage space is reduced. The values to be stored can be seamlessly stored in a FIFO memory, whereby an address is determined as a function of the length of the symbol periods, under which the desired value can be accessed in the FIFO memory.

14 Claims, 4 Drawing Sheets

METHOD AND DEVICE FOR DIGITAL FILTERING OF INTERPOLATED VALUES

Figure 1:
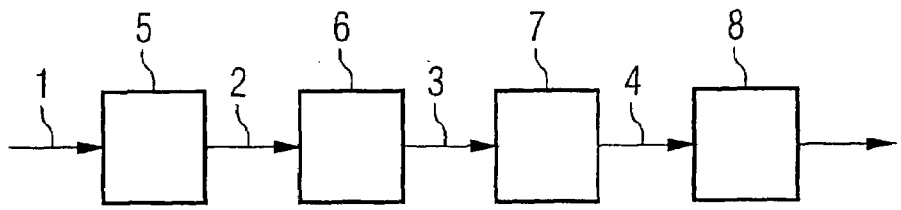

The present invention relates to a method as well as a device for digital filtering of a time-discrete input signal, which is produced by interpolation using an integer or non integer amount of a pilot signal, whereby the frequency of the input signal is unequal to the frequency of the pilot signal and values of an output signal are computed from values of the input signal which originate from various times in the past.

With digital filtering of time-discrete signals, which is very widespread in communications technology, output signal values are computed from values of the input signal originating in the past. In this case at a specific time-point a value of the output signal is computed from values of the input signal, values which originate from various times in the past, whereby in addition with so-called recursive filters past values of the output signal may also be considered. Dependent on the desired filter characteristic in this case values of the input signal originating from various times in the past are needed. Usually it can be assumed that the more complex the desired filter characteristic, the further back in the past values of the input signal are needed. A complex filter characteristic for example can be steep flanks, small ripples in the blocking state region and/or conducting state region or several blocking state regions and/or conducting state regions.

Usually digital filters are implemented in integrated semiconductors, so that the storage needed for the necessary input signal values represents an unfavourable cost with regard to the space required for the integrated semiconductor and its power consumption.

The object of the present invention is to create a method as well as a device of the type described at the beginning, with which minimal circuit complexity and low power consumption are achieved. This object is achieved according to the invention by a method with the features of claim 1 or a device with the features of claim 14. The sub-claims in each case define preferred and advantageous embodiments of the present invention.

The values of the input signal, which are necessary for computing the values of the output signal, according to the invention are stored in compressed form or are first compressed and then input in compressed form in a memory. From this memory the values are retrieved according to the requirements for computing the output signal. Advantageously the memory is a first-in-first-out memory, in which the resultant compressed values of the input signal are input at one end, the values already stored in the first-in-first-out memory being shifted along, since when comparing the values of the output signal only the values of the input signal which do not originate in the past by more than a specific number of time stages must always be retrieved.

By compressing the values of the input signal the fact that the value of the input signal is partly redundant when the input signal is produced by interpolation from a pilot signal is exploited. This means that the values of the input signal can be compressed without any loss and at the same time the data content can be reduced. In this way the circuit complexity in a device for digital filtering and the space required when implemented in an integrated semiconductor can be reduced; the power consumption is also reduced since due to the decreased memory fewer switching operations arise.

Figure 7:
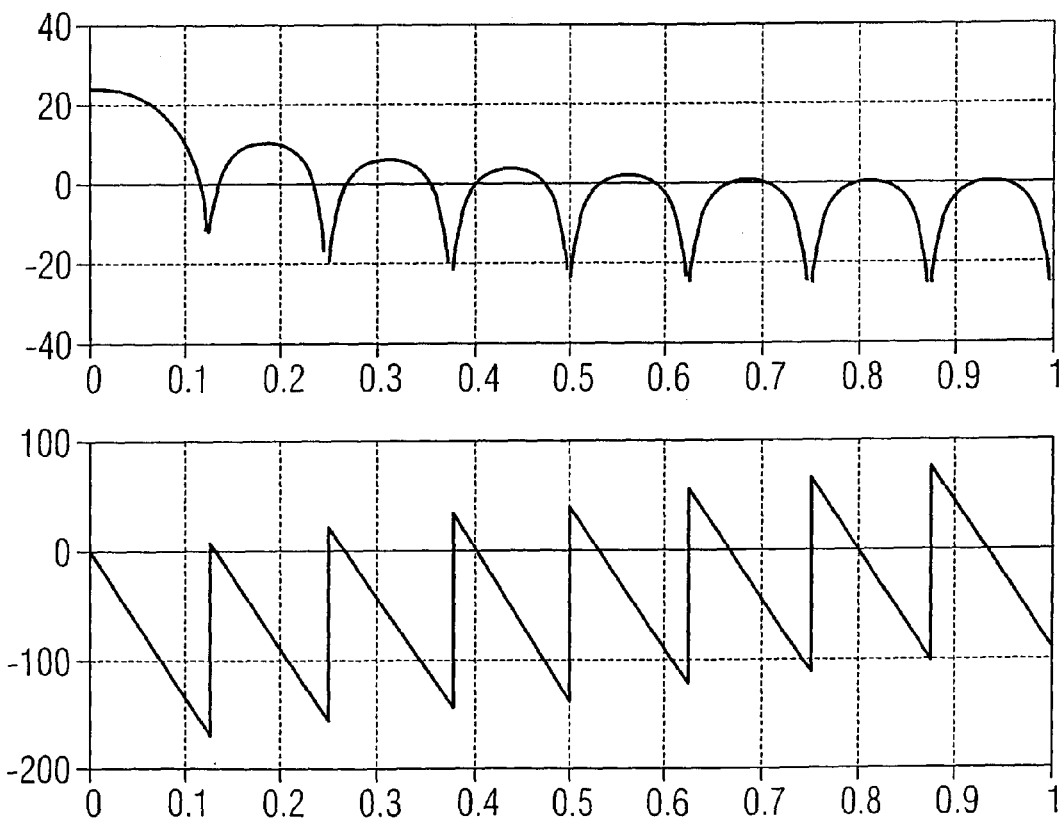

Advantageously the implemented digital filter is formed as a comb filter. Comb filters possess a wavy stop band, as represented for example in FIG. 7 top. The associated phase progression is represented in FIG. 7 bottom. Comb filters possess a plurality of local minimas with specific intervals between one another, which can be used advantageously for eliminating periodic spectral fractions. For example variable comb filters of a more arbitrary and more variable or programmable level can be implemented with the present invention. The same applies for interpolation using the method according to the invention.

Periodic spectral fractions of this kind arise in particular when multiplying a frequency by a factor. The factor in this case can be both an integer as well as a non-integer amount and both >1 as well as <1.

Advantageously the values of the input signal are run-length-coded, whereby the occurrence of coherent ranges of equal values can be exploited. Advantageously the values of the input signal are divided into symbol periods, in which a coherent range of non redundant memory values and one coherent range or two coherent ranges of constants arise, which do not have to be stored explicitly, but can be determined or reconstructed in another way.

When storing the values of the symbol periods in this case only the non redundant memory values are stored, since the redundant constants can be determined in another way.

For example it is possible to define as constants all those values of the input signal which are equal to the preceding signal, so that these values no longer have to be stored, since they can be determined on the basis of the preceding value. Only one amount for the number of equal sequential constants has to be stored. This can either be the number of constants or the total number of all values during a specific symbol period.

Advantageously however depending on the method of interpolating the input signal from the pilot signal, the number of memory values arising in one symbol period, which are not redundant and have to be stored individually is determined. In this case only the beginning or the location of the range of the memory values in the sequence of the input signal values must be determined and from this beginning the number of input signal values, which corresponds to at least the minimum number for memory values determined previously. The constants arising before the next range of memory values begins no longer have to be stored, however the number of total values in the symbol period are stored, so that the symbol period can be completely reconstructed from the total value number and the stored memory values.

When computing the values for the output signal it must be possible to access the necessary input signal values. For this purpose the input signal values stored in compressed form must again be decompressed. If the input signal values to be stored are divided into non-redundant memory values, which have to be stored individually, and constants, which can be reconstructed in another way and therefore do not have to be stored, the signal values can be decompressed advantageously due to the fact that in order to access a specific value of the input signal it is first determined whether this specific value was a memory value or a constant. If the specific value was a memory value, the address is computed by means of which the look-up value can be accessed in the memory. Otherwise if the look-up value was a constant, this is reconstructed in another way. In order to reconstruct the constants for example it is proposed that all constants can be computed from the immediately preceding memory value or in the simplest case are equal to this. Here in order to access a specific value of the input signal the address is determined for the memory value, which represents either the look-up input signal value, because the look-up value of the input signal was a memory value or depending on which the look-up value of the input signal can be computed. If the constants, which are not stored correspond in each case to the immediately preceding memory value, the address of the immediately preceding memory value in this case can be computed if there is access to a constant and this can be used as the look-up value.

For all these computations the location of the memory value ranges within the sequence of the input signal values must be known. This information can for example be stored in the form of the total value numbers of the symbol periods.

Figure 2:
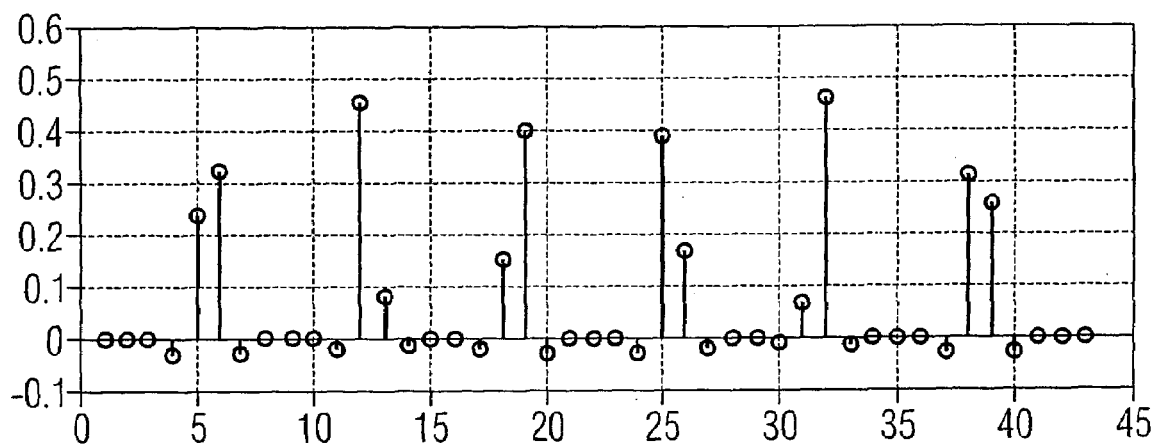
Figure 2:
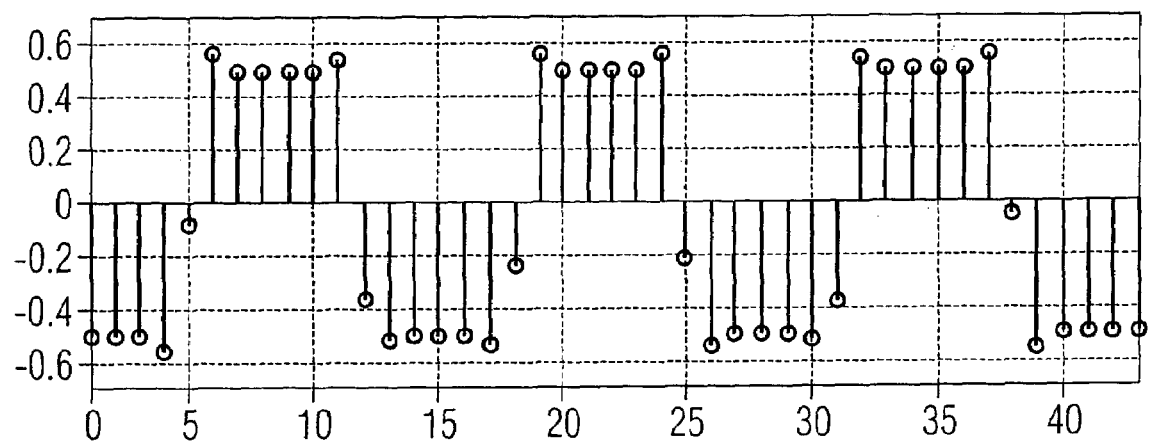
Figure 3:
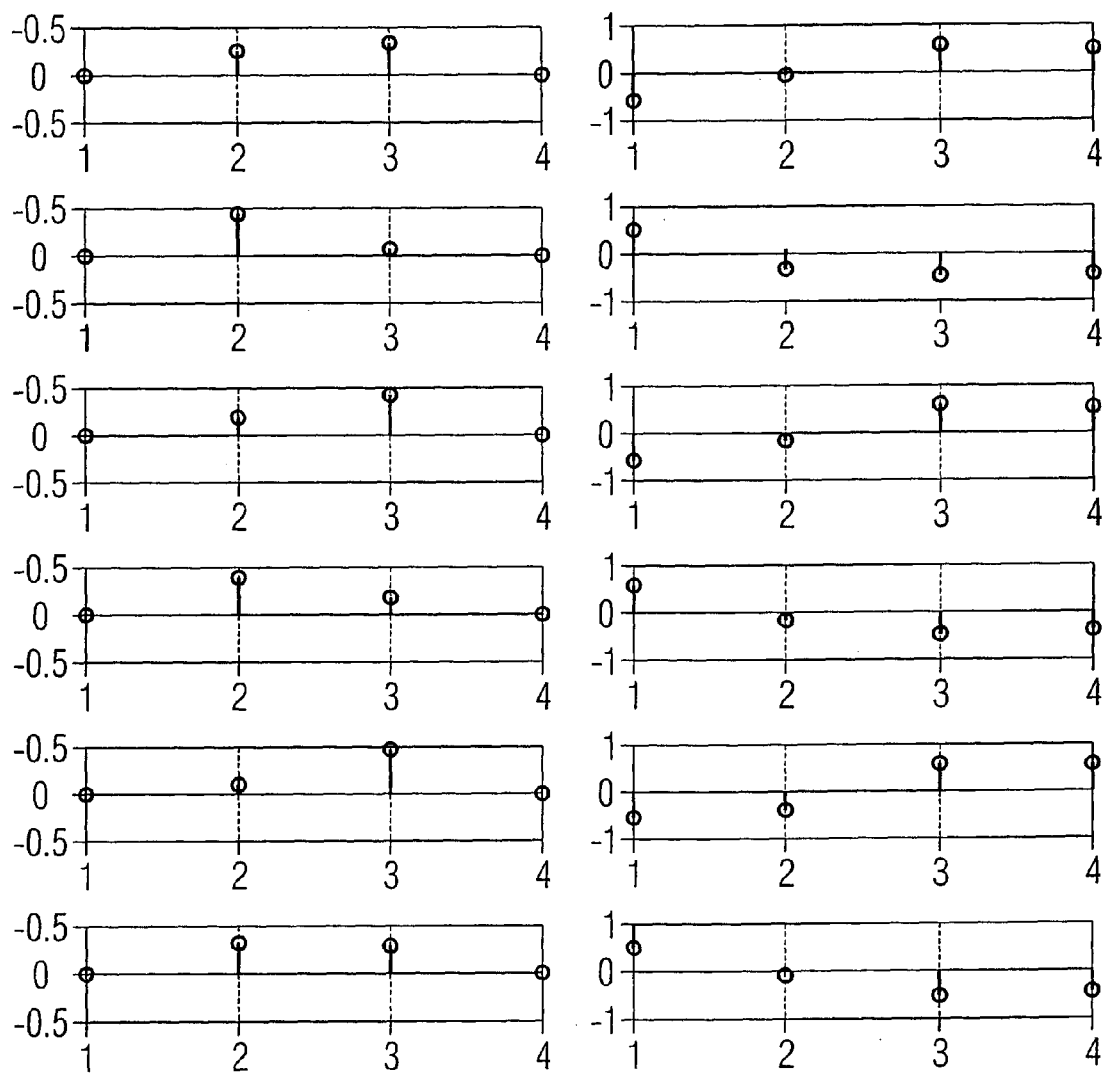
Figure 4:
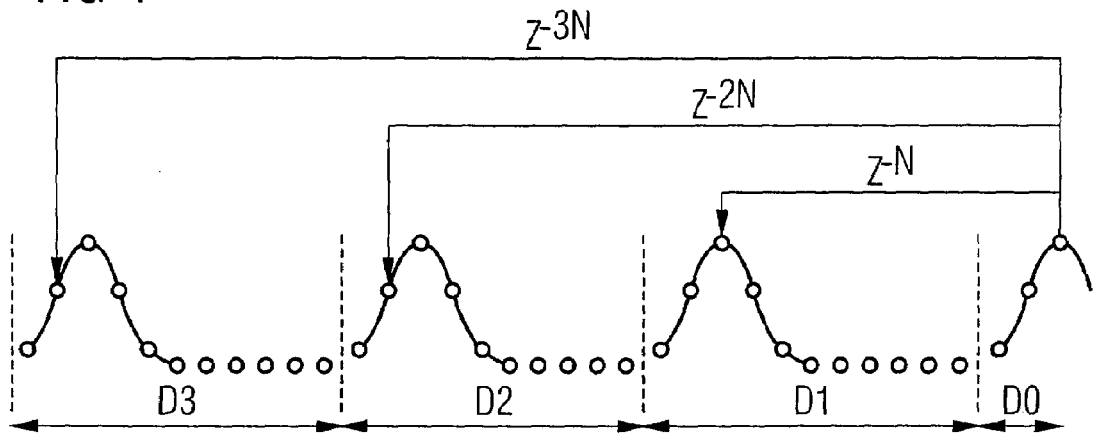
Figure 5:
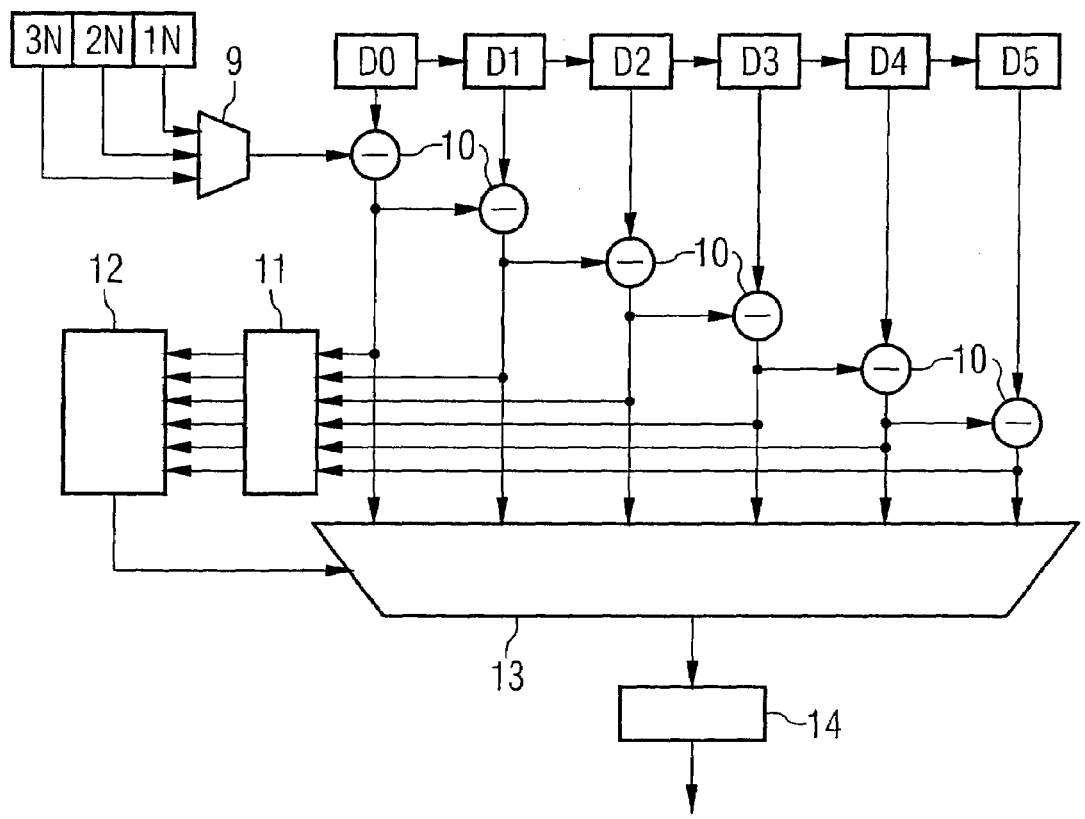
Figure 6:
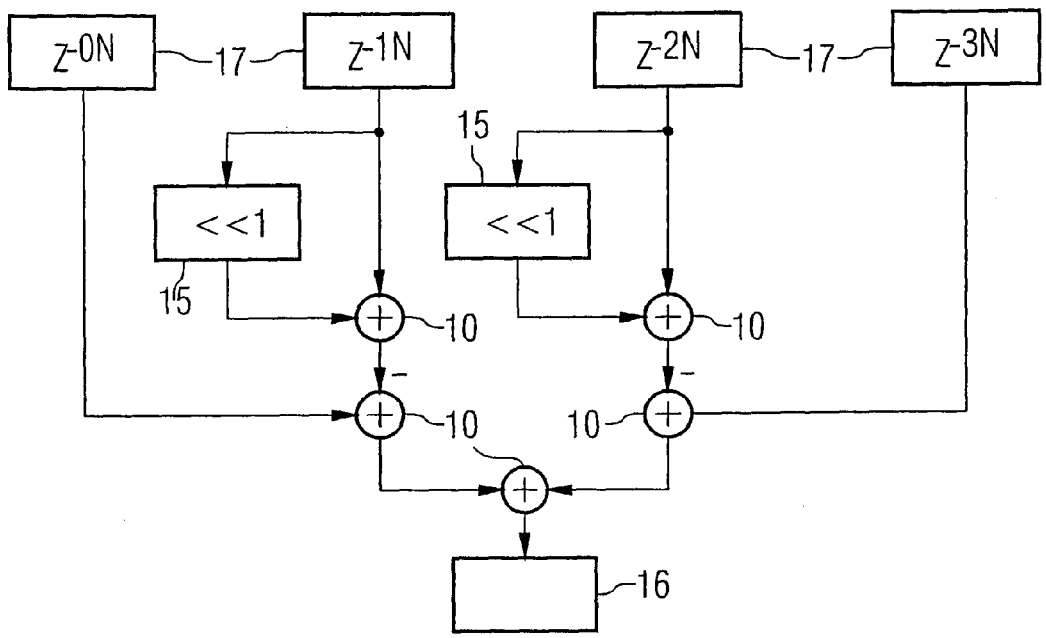

FIG. 1 shows the diagrammatic structure of a switching configuration for the synchronization and analogue emission of a data signal, FIG. 2 shows the progressions of the synchronized data signal, FIG. 3 shows the progressions of data-carrying values in sections of the profile in accordance with FIG. 2, FIG. 4 shows the progression of an input signal with time discrete values, gained by synchronization, FIG. 5 shows a block diagram of a switching configuration for decompression of values of the input signal stored in compressed form or for computation of the address in order to access values of the input signal stored in compressed form, FIG. 6 shows an implementation of the digital differentiator using the input values, and FIG. 7 shows at the top the stop band and at the bottom the associated phase curve of a comb filter.

The invention is described in detail below on the basis of a preferred embodiment with reference to the attached drawings.

FIG. 1 describes the block diagram of a device for transmission of data in accordance with the SHDSL system. In this case a data signal 1 contains the data to be transmitted. The data to be transmitted are basically converted in a digital/analogue converter 8 into analogue values, which are fed to a line used for data communication whereby the cycle with which the digital/analogue converter 8 produces the analogue values is to be kept constant.

In contrast to the cycle of the analogue values however different rates for the data in the data signal 1 should be possible. For this reason there is a need to convert data arising at a first frequency in the data signal 1 into a series of analogue values at a second frequency. For this purpose the data signal 1 is synchronized, further values being computed by interpolation from the values of the data signal 1. Initially the data signal 1 is passed through a pre-filter to remove undesirable spectral fractions.

A synchronizer 6 with variable rate change or frequency ratio is connected to the pre-filter 5. The synchronizer 6 is also able to implement odd-numbered frequency ratios so that the frequency of an input signal 3 at the output of the synchronizer 6 can also be a non-integer multiple of the pilot signal 2. Further spectral fractions in the input signal 3 result from the rate change in the synchronizer 6. These are to be filtered out in a digital filter 7, the output signal 4 of which is finally fed to the digital/analogue converter 8. The digital filter 7 serves as an anti-aliasing filter for the digital/analogue converter 8.

A comb filter is to be used as filter type for the digital filter 7, the progression curve of the comb filter being diagrammatically illustrated in FIG. 8 at the top together with the phase curve shown below. The comb filter has the advantage that it possesses several zeros, with which periodic spectral fractions can be suppressed particularly well.

The Z transform for the transfer function of a comb filter can generally be stated using the following formula:

$$H^K(z) = \frac{1}{N^K}\left[\sum_{i=0}^{N-1} z^{-1}\right]^K$$

$$= \frac{1}{N^K}\left[\frac{1-z^{-1}}{1-z^{-1}}\sum_{i=0}^{N-1} z^{-1}\right]^K$$

$$= \frac{1}{N^K}\left[\frac{\sum_{i=0}^{N-1} z^{-1}(1-z^{-1})}{1-z^{-1}}\right]^K$$

$$= \frac{1}{N^K}\left[\frac{\sum_{i=0}^{N-1} (z^{-1}-z^{-i-1})}{1-z^{-1}}\right]^K$$

$$= \frac{1}{N^K}\left[\frac{1-z^{-N}}{1-z^{-1}}\right]^K$$

In the last term of the above equation the transfer function has been converted into a break, in which the counter forms a differentiator and the denominator an integrator.

In the embodiment described the analogue values which are produced by the digital/analogue converter 8 are transmitted at a frequency of 20.48 MHz. The rate, at which the data accumulate in the data signal 1 can however be very low. The spectral fractions of the data signal 1 result, depending on how the data are coded in the data signal. For example a frequency of 66.6 KHz for the data signal 1 results if the data transmission rate is 200 kbps. Due to the comparatively low-frequency spectral range of the data signal 1 image frequency ranges develop after the synchronization at relatively short intervals. A filter for suppression of these frequency ranges in the case of low data rates for the data signal 1 must therefore have a low cutoff frequency.

FIG. 2 shows the progression of the input signal 3 with a total frequency ratio of 26.3 and a $3^{rd}$ order interpolation. In the top diagram the coding is represented by 0 and +1 for clarity, whereby no repeater is provided and coding can also take place with other values. In the bottom diagram the coding is represented by ±1, whereby a repeater is provided.

In both diagrams it can clearly be seen that only the transitions are affected by the interpolation. In between several similar values for the input signal 3 occur. After a number of values for the input signal 3, which is equal to the interpolation order plus 1 . . . , a constant value results. The values of the input signal 3 can therefore be divided into symbol periods, which in each case correspond to a data value in the data signal 1. Due to the non-integer amount frequency ratio of 6.575 a symbol period may comprise 6 or 7 values of the input signal 3.

Since in any case within a symbol period part of the values is constant, the data are suitable for compression without any loss, in particular by run-length-coding. The number of redundant values of the input signal 3, which correspond to an invariable pre-determined value, rises with the frequency ratio.

In the embodiment described four (interpolation order +1) values of the input signal 3 are stored for the symbol period and also the length of the respective symbol period. Naturally only the four values of each symbol period which carry the data and are not equal to a constant are stored.

FIG. 3 shows the values which are stored in two columns for the two curves of values in FIG. 2. Here for six symbol periods in each case the four values of the input signal 3, which are stored according to the progression indicated in FIG. 2 at the top, are indicated in the lefthand column. The righthand column in the same way for the progression of the values of the input signal 3 shown in the bottom diagram in FIG. 2 represents the four values to be stored in each case for the six symbol periods. The values represented in FIG. 3 are designated memory values in the following, since they are the data carriers and must be explicitly stored. The remaining values of the input signal 3 are designated constants, since they correspond to a constant which is known from the very beginning and can thus be easily reconstructed also without storage. In the case of the progression of the input signal 3 represented in FIG. 2 top the constants are always 0. In the case of the diagram represented in FIG. 2 bottom the constants in each case assume the state of the preceding memory value.

The comb filter used in the embodiment described is to be a comb filter of the $3^{rd}$ order. Thus, based on the general formula for a comb filter the following formula results as Z transform for the transfer function:

$$H^3(z) = \frac{1}{N^K}\left[\frac{1-z^{-N}}{1-z^{-1}}\right]^3 = \frac{1}{N^K}(1-z^{-N})^3\left(\frac{1}{1-z^{-1}}\right)^3$$

In the formula detailed N describes an interpolation factor or decimation factor, which indicates the number of zeros in the transfer function. The decimation factor N is advantageously selected as a function of the frequency ratio, whereby the decimation factor N is an integer amount and can be gained by rounding off the frequency ratio or deliberately tuned out.

In the following initially the counter of the transfer function for the comb filter, which describes a differentiator, will be detailed. In the case of the present $3^{rd}$ order comb filter the counter of the transfer function results in the equation:

$$H^3(z)=(1-z^{-N})^K=1-3z^{-N}+3z^{-2N}-z^{-3N}$$

From the above formula it is clear that 3 times N past values of the input signal 3 must be accessed. It should be noted that the method of computing the differential is not important for the present invention.

As described above the four data-carrying values for each symbol period of the input signal 3 and also the length of the respective symbol period are stored. In this case the memory values are seamlessly stored in a first-in-first-out memory. In order to retrieve the correct value from this, only the correct storage address of the first-in-first-out memory need be computed.

In the following the computation of the addressing is described with reference to FIGS. 4 and 5, whereby the interpolation order is 5 and the frequency ratio is 10.5. The values of the input signal 3 are shown in FIG. 4, whereby the values are divided into symbol periods D0 to D3. The symbol period D0 is the current symbol period, of which only three values are present. The values or symbol periods D1 to D3 lying on the left are the preceding symbol periods. The symbol period D1 comprises 11 values, the symbol period D2 comprises 10 and the symbol period D3 again comprises 11 values. Since the interpolation order is 5, 6 values are stored for each symbol period. The values are divided into the symbol periods in this case in such a way that the 6 non-redundant memory values are located at the beginning of each symbol period. The decimation factor N selected here is equal to 11. Assuming the current value of the input signal 3 shown on the right, the values are indicated by 3 arrows, which go back 1 times N, 2 times N and 3 times N and correspond to the terms $z^{-N}$, $z^{-2N}$ and $z^{-3N}$.

FIG. 5 shows a block diagram for computing the address in order to access the correct value of the input signal 3. In blocks D0 to D5 illustrated above, the lengths of the preceding symbol periods are generally stored in registers or memory cells. Register D0 contains the length of the actual symbol period, in the present example 3. Register D1 would have the memory content 11, register D2 the memory content 10 and register D3 the memory content 11. The same applies for registers D4 and D5. Since in the present case the comb filter is the $3^{rd}$ order, it would actually be sufficient to store the current symbol period plus the preceding 3. In this case register D5 would be redundant, but is kept for purposes of flexibility, if the interpolation filter is to be tuned out.

Depending on whether the value $z^{-N}$, $z^{-2N}$ or $z^{-3N}$ is needed, a multiplexer 9 is actuated, which prescribes a corresponding value 1 times N, 2 times N or 3 times N (where N=11). The output of the multiplexer 9 is fed to a subtracter 10, which deducts the content of register D0 from the output signal of the multiplexer D9. The content of register D1 is deducted from the result of this subtraction by a following subtracter 10. This continues as far as the register D5. Since the value prescribed by the multiplexer 9 changes between 11 and 33, although the memory contents D0 to D5 are ≦11, depending on the concrete register content the result of the first subtractions will still be positive, until whenever the subtraction in a subtracter 10 provides a negative result. This sign change is recognized by a block 11, which thus defines in which symbol period the look-up value falls. The look-up value falls into the symbol period D0 to D5, the assigned subtracter 10 of which provides a negative output value as the first. This subtraction result negatively appearing first is passed onto a converter 12, which determines in which symbol period the look-up value is to be found. For this purpose the converter 12 produces a selection signal for a multiplexer 13 from the select signal for MUX emitted by the block 11. The result is passed onto the multiplexer 13, at the inputs of which the subtraction results of the subtracters 10 lie and which by means of the control through the converter 12 emits the location, at which the look-up value can be found in the corresponding symbol period.

The multiplexer 13 thereupon emits the desired value, which is received by a terminal block 14, ensuring that the last stored value is emitted if the values of a symbol period which are not stored are accessed. For this purpose the terminal block 14 forms the absolute value of the applied value and saturates it to interpolation order +1. As can be seen in FIG. 4, only the first 6 values of each symbol period D0 to D3 are stored. The rest are always 0 and therefore do not have to be stored. If these values are accessed because the computation requires it, the terminal block 14 ensures that the value stored last in this symbol period is emitted as the value.

The decompression circuit for providing the input values described above, can also be formed sequentially or iteratively. Furthermore the decompression circuit described can be implemented with adders or other arithmetical means instead of subtracters.

FIG. 6 illustrates the implementation of the counter of the comb filter. Blocks 17 reproduce the input values $z^{-3N}$, $z^{-2N}$ and $z^{-3N}$ or $z^{-0N}=1$. Blocks 15 in each case represent shift operations, with which the input value is moved one binary digit to the left, which equates to multiplication by the factor 2. The values $z^{-1N}$ and $z^{-2N}$ are thus multiplied in each case by 2 and added together, so that multiplication by the factor 3 results. The term 3 times $z^{-1N}$ is then subtracted from the term $z^{-0N}$ or 1, whereas the value $z^{-3N}$ is subtracted from the term 3 times $z^{-2N}$. The results are added together and provide the output value 16.

This circuit now performs the actual computation of the differentiator of the third order as part of the $3^{rd}$ order comb filter. Computation using the polynomial already described $$H^3(z)=1-3z^{-N}+3z^{-2N}-z^{-3N}$$

is preferred over the cascade connection $$H^3(z)=(1-z^{-N})(1-z^{-N})(1-z^{-N})$$

since the values $z^{-KN}$ can be input from the same compressing FIFO.

The denominator for the desired transfer function of the comb filter represents a simple $3^{rd}$ order integrator, which will not be detailed further below, since its implementation is familiar to any person skilled in the art.

Finally it can be stated that in the case of a comb filter an excellent anti-aliasing filter can be created with the present invention, whereby the typical disadvantages of comb filters can be avoided. In particular minimal storage space for the preceding values of the input signal and therefore minimum power consumption are achieved.

The invention claimed is:

1. Method for digital filtering of a time-discrete input signal, which has been produced by interpolation of a time-discrete pilot signal, wherein the frequency of the input signal is unequal to the frequency of the pilot signal, the method comprising the steps of:
   compressing values of the input signal;
   storing the compressed values of the input signal; and
   computing values of an output signal by digital filtering as a function of the stored values of the input signal originating from various times in the past.

2. Method according to claim 1, wherein the compressing step comprises compressing the values of the input signal without any loss.

3. Method according to claim 1, further comprising the step of run-length-coding the values of the input signal.

4. Method according to claim 1, further comprising the step of dividing the values of the input signal into symbol periods, in which a coherent range of memory values of the input signal, which are different from one another, and one coherent range or two coherent ranges of constants of the input signal, which are equal to the preceding value of the input signal, arise in each case, and
   wherein the storing step comprises storing only the memory values of the input signal and the total value number of the symbol periods.

5. Method according to claim 4, further comprising the steps of:
   determining, when a specific stored value of the input signal is accessed, the stored value as a function of the lengths of stored symbol periods to which symbol periods the specific value of the input signal belongs, at which point the specific value of the input signal is located in the symbol period; and
   using, dependent on whether the point of the specific value within the symbol period corresponds to a memory value or a constant, a corresponding memory value of the input signal or a reconstructed constant as specific value.

6. Method according to claim 4, further comprising the step of:
   inputting the memory values of the different symbol periods seamlessly into a memory.

7. Method according to claim 1, further comprising the step of dividing the values of the input signal into symbol periods, in which an invariable number of memory values of the input signal, the number of memory values being determined as a function of the order of the interpolation, and one coherent range or two coherent ranges of constants of the input signal arise, wherein the constants are values of the input signal which are equal to the value of the preceding input signal, and
   wherein the storing step comprises storing only the stored values and the total value number of the symbol periods.

8. Method according to claim 7, further comprising the steps of:
   determining, when a specific stored value of the input signal is accessed, the stored value as a function of the lengths of stored symbol periods to which symbol periods the specific value of the input signal belongs, at which point the specific value of the input signal is located in the symbol period; and
   using, dependent on whether the point of the specific value within the symbol period corresponds to a memory value or a constant, a corresponding memory value of the input signal or a reconstructed constant as specific value.

9. Method according to claim 7, further comprising the step of:
   inputting the memory values of the different symbol periods seamlessly into a memory.

10. Method according to claim 1, wherein the storing step comprises storing the values of the input signal in a compressing first-in-first-out memory.

11. Method according to claim 1, wherein the digital filter is implemented as a comb filter.

12. Method according to claim 1, further comprising the step of:
    producing the input signal by integer or non-integer amount frequency multiplication of the pilot signal.

13. Method according to claim 1, wherein the digital filtering is an anti-aliasing filtering.

14. Device for the digital filtering of a time-discrete input signal, comprising:
    a synchronizer for producing the input signal by interpolation of a time-discrete pilot signal, wherein the frequency of the input signal is unequal to the frequency of the pilot signal;
    a storing means to compress and store compressed values of the input signal needed in order to compute values of the output signal; and
    computing means to compute values of an output signal from values of the input signal originating at various times in the past.

* * * * *